(12) United States Patent
Mickelsen

(10) Patent No.: US 8,874,395 B2
(45) Date of Patent: Oct. 28, 2014

(54) PRE-CHARGING FILTERS TO REDUCE SETTLING TIME

(75) Inventor: Jeremy Mickelsen, Denver, CO (US)

(73) Assignee: Echostar Technologies L.L.C., Englewood, CO (US)

( * ) Notice: Subject to any disclaimer, the term of this patent is extended or adjusted under 35 U.S.C. 154(b) by 418 days.

(21) Appl. No.: 13/285,441

(22) Filed: Oct. 31, 2011

(65) Prior Publication Data

US 2013/0110432 A1    May 2, 2013

(51) Int. Cl.
*G01R 19/25* (2006.01)
*G06F 19/00* (2011.01)
*G01R 19/00* (2006.01)
*G01R 19/165* (2006.01)

(52) U.S. Cl.
CPC ...... *G01R 19/0084* (2013.01); *G01R 19/16542* (2013.01)
USPC ................. 702/64; 363/19; 411/469; 702/63

(58) Field of Classification Search
CPC .................... G01R 19/0084; G01R 19/16542; G01R 27/2605; G01R 29/023; G01R 31/2884; G01R 31/31725; G01R 31/31727; G01R 31/3167; G01R 31/02; G01R 27/02; G04F 10/105; G04F 10/04; H02J 1/00; H01M 10/42; H01M 10/46; H01M 1/4258
USPC ........... 702/63, 64, 65, 79, 89, 117, 123, 125, 702/176; 320/128, 164, 166; 324/658, 678; 363/19, 21.01; 411/469
See application file for complete search history.

(56) References Cited

U.S. PATENT DOCUMENTS 8,368,408 B2 * 2/2013 Bartling ........................ 324/678
2004/0196669 A1 * 10/2004 Thrap ............................. 363/19
2009/0285655 A1 * 11/2009 Gardner et al. ............... 411/469

* cited by examiner

*Primary Examiner* — John H Le
(74) *Attorney, Agent, or Firm* — Kilpatrick Townsend & Stockton LLP

(57) ABSTRACT

Various arrangements for determining a voltage of a voltage source using pre-charging are presented. Such arrangements may include a measurement module which includes an analog to digital converter, a driver, and an interface. The interface may be electrically coupled with the analog to digital converter and the driver. The driver may be configured to output current to charge a capacitor. After a first predefined period of time, the driver may stop outputting current to pre-charge the capacitor. After the driver has stopped pre-charging the capacitor and a second predefined period of time has elapsed, the analog to digital converter may be configured to measure a voltage of the capacitor. Such arrangements may include a capacitor, wherein the capacitor is electrically coupled with the interface of the measurement module.

10 Claims, 8 Drawing Sheets

PRE-CHARGING FILTERS TO REDUCE SETTLING TIME

BACKGROUND

In many situations, it is desirable to monitor the voltage of one or more voltage sources, such as batteries. To accurately measure a voltage of a battery, a significant amount of time and/or power may be used. For example, a remote control of a television may use a single AA battery for power. While it may be desirable to determine the voltage of the battery, it may also be desirable to conduct the measurement in a power-efficient manner to conserve the battery's power.

SUMMARY

Various arrangements for determining a voltage of a voltage source using pre-charging are presented. In some embodiments, a system for determining a voltage of a voltage source using pre-charging is present. The system may include a measurement module. The measurement module may include an analog to digital converter, a driver, and/or an interface. The interface may be electrically coupled with the analog to digital converter and the driver. The driver may be configured to output current to charge a capacitor. After a first predefined period of time, the driver may stop outputting current to pre-charge the capacitor. After the driver has stopped pre-charging the capacitor and a second predefined period of time has elapsed, the analog to digital converter is configured to measure a voltage of the capacitor. The system may include a capacitor, wherein the capacitor is electrically coupled with the interface of the measurement module. The system may include a switching module configured to electrically couple the interface of the measurement module and the capacitor with the voltage source at least while the driver is charging the capacitor and the analog to digital converter is measuring the voltage of the capacitor.

Embodiments of such a system may include one or more of the following: The measurement module may further comprise a processing module configured to determine the first predefined period of time using one or more previous measurements of the capacitor's voltage. During the second predefined period of time, the capacitor may be electrically coupled with the voltage source. The first predefined period of time may be selected to charge the capacitor to a median voltage. The system may further include a voltage divider circuit comprising a first resistor and a second resistor. The first resistor may be electrically coupled with the voltage source and the interface. The second resistor may be electrically coupled with the interface. The measurement module may be part of a microcontroller of a remote control. The voltage source may be at least one battery. The measurement module may further comprises a multiplexer. The driver and analog to digital converter may be electrically coupled with inputs of the multiplexer. An output of the multiplexer may be electrically coupled with the interface.

In some embodiments, a method for determining a voltage of a voltage source using pre-charging may be presented. The method may include pre-charging, a capacitor, using a driver, for a first period of time. The method may include after pre-charging, waiting a second period of time. During the second period of time, the capacitor may be electrically coupled with the voltage source. The method may include, after the second period of time, measuring a voltage of the capacitor.

Embodiments of such a method may include one or more of the following: The method may include determining the first period of time to pre-charge the capacitor for a second measurement of the voltage of the voltage source. The method may include coupling the capacitor to the voltage source prior to pre-charging the capacitor using the driver. The method may include uncoupling the capacitor from the voltage source after measuring the voltage of the capacitor. The method may include coupling the capacitor to the voltage source prior to the second period of time, but after substantially pre-charging the capacitor using the driver. The method may include uncoupling the capacitor from the voltage source after measuring the voltage of the capacitor. Determining the first period of time to pre-charge the capacitor for the second measurement of the voltage of the voltage source may comprise using the measured voltage of the capacitor. Pre-charging of the capacitor and measuring the voltage of the capacitor may be performed by a microcontroller unit. The voltage source may be electrically coupled with the capacitor via a voltage divider circuit comprising a first and second resistor. Charging of the capacitor may occur faster using the driver than the voltage source via the voltage divider circuit. The method may include calculating the voltage of the voltage source using the measured voltage of the capacitor and a ratio of the first and second resistors of the voltage divider circuit. The voltage source may be one or more batteries. The measured voltage may be used to provide a user with an indication of a charge level of the one or more batteries.

In some embodiments, a system for determining a voltage of a battery of a remote control using pre-charging is presented. The system may include a transmitter configured to transmit data to a set top receiver. The system may include the set top receiver configured to receive data from the transmitter and store battery charge information. The system may include the remote control. The remote control may include a capacitor, a microcontroller unit (MCU). The MCU may include an analog to digital converter (ADC); and a driver. The driver and the ADC may be electrically coupled with the capacitor. The driver of the MCU may be configured to output current to pre-charge the capacitor. After a first predefined period of time, the MCU may be configured to stop outputting current via the driver to pre-charge the capacitor. After the driver of the MCU has stopped pre-charging the capacitor and a second predefined period of time has elapsed, the ADC of the MCU may be configured to measure a voltage of the capacitor. A switch may be present that is configured to electrically couple the battery with the ADC and the driver of the MCU at least while the driver is charging the capacitor and the analog to digital converter is measuring the voltage of the capacitor. The MCU may be further configured to output an indication of the voltage of the capacitor to the transmitter. The set top receiver may be configured to present battery charge information via a display based on the voltage of the capacitor.

BRIEF DESCRIPTION OF THE DRAWINGS

A further understanding of the nature and advantages of various embodiments may be realized by reference to the following figures.

DETAILED DESCRIPTION

Figure 1:
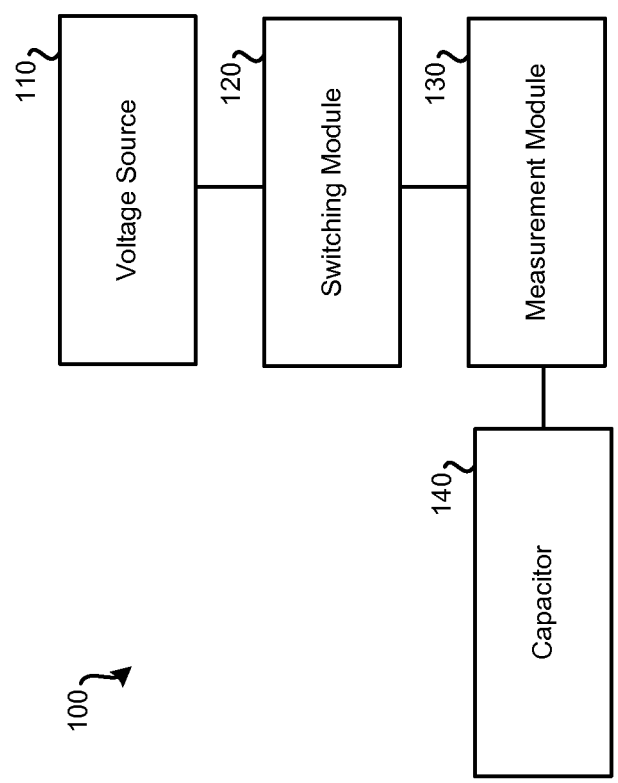
FIG. 1 illustrates a block diagram of an embodiment of a system for determining a voltage of a voltage source using pre-charging.

In order to measure the voltage of a voltage source, such as a battery, an analog to digital converter may be used to measure an analog voltage and create a digital representation of the voltage. This digital representation of the voltage may be used for purposes such as providing a user an indication of when the battery should be recharged or replaced. While measuring the voltage of such a voltage source may be useful, conducting such a measurement may consume power. As such, it may be desirable to perform such a measurement in a manner that consumes a small amount of power. It may also be desirable to measure voltages of sources that are above the maximum useful range of an analog to digital converter (ADC). Measurements of voltages below the minimum useful range of the analog to digital converter may also be desired, and can be achieved with complementary circuitry. For example, by using a resistive voltage divider with the divider input at the voltage to be measured, the divider common point at the ADC's high reference, and the divider output at the ADC input, voltages below the ADC's low reference can be used as inputs while keeping the ADC input between the high and low references so that meaningful measurements can be taken. The input voltage can then be calculated using the known resister divider ratio. Further, it may be desirable to measure signals at intervals and disable interface circuitry and the ADC between measurements to reduce power consumption when measurements are not being taken.

If the ADC interface is connected for only a short period of time, each sample may be considered individually such that the quantity of charge per sample is the principal determinant of impedance rather than quiescent current. It is in the charge per sample sense that "current" is used in the remainder of the document rather than continuous current. In instances where long term voltages or currents are referenced (in comparison to per-sample quantities), the term quiescent is used.

By using a voltage divider circuit, such as one comprising two high-resistance resistors coupled between the voltage source and ground, a voltage tap can be accessed with only a small amount of power dissipated by the divider. However, in order to measure the voltage using an analog to digital converter (ADC), the ADC may need to draw at least a minimum amount of current. As such, if the effective impedance of the voltage divider circuit is great enough, the voltage determined by the ADC may be inaccurate or a measurement may not be able to be completed by the ADC due to the low level of current supplied by the voltage divider circuit within a sample period.

In order to increase the amount of available current that can be supplied by a high-resistance voltage divider circuit (without decreasing the resistance of the resistors), a capacitor may be added to the voltage divider circuit across the output and common point of the divider. When coupled with the voltage source via the voltage divider circuit, the capacitor, over time, may become charged to the quiescent voltage of the voltage divider circuit. When the ADC is triggered to measure the voltage, both the capacitor and voltage divider. As such, during a voltage measurement, the capacitor may serve as an additional source of current for the ADC to draw from, thus providing sufficient current to the ADC for an accurate voltage measurement. While the capacitor may permit an increased resistance voltage divider circuit to be used, the greater the resistance of the voltage divider circuit, the longer the capacitor may take to charge through the voltage divider circuit. Further, in order for the voltage measurement by the ADC to be accurate, the capacitor needs to be charged to nearly the quiescent voltage divider output, such that the voltage of the capacitor can be used to determine the voltage of the voltage source. As such, time and/or power may be wasted while waiting for the capacitor to be charged by the voltage source through the voltage divider circuit. Voltage measurements using a partially charged capacitor may be used if appropriate processing is applied to the measurement, and if the initial voltage of the capacitor is known, however the accuracy, resolution, and calculation overhead suffer.

Rather than using only the voltage source to charge the capacitor through the voltage divider circuit, another circuit may be used to pre-charge the capacitor. Once pre-charged, the capacitor may be coupled only with the voltage source through the voltage divider circuit (e.g., not coupled with the pre-charging circuit) for a period of time. As such, following the period of time, the voltage of the capacitor may substantially reflect the voltage of the voltage source within the voltage divider circuit (and not the voltage of the circuit used to pre-charge the capacitor). However, since at least some of the charging of the capacitor was conducted using another circuit (which may be configured to charge the capacitor faster by supplying more current and/or by using a higher voltage), the voltage measurement may be conducted sooner and/or with less overall power being consumed than if only the voltage source (through the voltage divider circuit) had been used to charge the capacitor.

Pre-charging of the capacitor may be dynamic. If an approximate voltage of the signal-of-interest is known, the capacitor may be pre-charged to the corresponding voltage. If the pre-charge voltage is fixed, this may be accomplished by adjusting the duration the pre-charge circuitry is enabled. This may decrease the amount of time that the capacitor needs to be coupled with only the signal-of-interest via the voltage divider circuit for the capacitor to accurately reflect the voltage of the signal-of-interest. As such, less power and/or time may be necessary in order to conduct the voltage measurement. The voltage that the capacitor is charged to may be based on a previously conducted voltage measurement. Also, based on a previously measured voltage of the capacitor, the amount of time that the capacitor is coupled with the pre-charge circuit may be adjusted. Charging of the capacitor from a completely discharged state may be necessary for each measurement because the capacitor may be disconnected from the voltage source in order to save power between voltage measurements. For example, voltage measurements may only occur once every few minutes, hours, days, or weeks.

FIG. 1 illustrates a block diagram of an embodiment of a system 100 for determining a voltage of a voltage source using pre-charging. System 100 includes: voltage source 110, switching module 120, measurement module 130, and capacitor 140. Voltage source 110, which also may be referred to as a signal-of-interest, supplies power to the other components of system 100. Voltage source 110 is the voltage source that is to have its voltage measured. As such, the voltage output by voltage source 110 may vary. For example, voltage source 110 may include one or more batteries (which may be single-use or rechargeable). Over time, the battery may deplete, thus the output voltage may decrease.

Switching module 120 may serve to alternatively couple and uncouple voltage source 110 from measurement module 130 and capacitor 140. When voltage source 110 is uncoupled from measurement module 130 and capacitor 140, measurement module 130 and/or capacitor 140 may either consume no power or may consume less power. Switching module 120 may be various types of switches, such as: a transistor, a MOSFET, or a mechanical switch. Whether the switch couples voltage source 110 with measurement module 130 and capacitor 140 or uncouples voltage source 110 from measurement module 130 and capacitor 140 may be based on an input (not illustrated) to switching module 120. The input may receive a trigger signal that controls which state switching module 120 is in.

Measurement module 130 measures the voltage of capacitor 140. Measurement module 130 may include a voltage divider circuit. A voltage divider circuit may include two resistors, in series between voltage source 110 (via switching module 120) and a common voltage (such as ground) with the voltage being measured between the two resistors in series and the common voltage. Based on the value of the resistors, the voltage of voltage source 110 may be calculated. The higher the resistance of the resistors, the less current that will be drawn by the resistors from voltage source 110 and thus less power is consumed while the divider is enabled. However, in order for measurement module 130 to conduct an accurate voltage reading, a minimum amount of current may be required to be drawn by measurement module 130. Measurement module 130 may be configured to: 1) measure a voltage; and 2) charge capacitor 140. While such functions are illustrated in FIG. 1 as being performed by a single measurement module 130, separate modules may be used to perform each function.

Measurement module 130 may comprise a driver that charges capacitor 140 for a period of time. This driver of measurement module 130 may be uncoupled from capacitor 140 for a second period of time. For example, one or more components of measurement module 130, such as a driver, may enter a high-impedance mode. While in such a mode, capacitor 140 may remain connected with voltage source 110 via switching module 120 and the voltage divider circuit. As such, during this second period of time, the charge of capacitor 140 may charge to the voltage of voltage source 110. The following example is provided for illustration purposes only. Voltage source 110 may be 4 V and measurement module 130 includes a voltage divider circuit having two 100 kilo-ohm resistors. Measurement module 130 (possibly in conjunction with voltage source 110) may be used to quickly charge capacitor 140 for a first period of time (which may result in the capacitor being charged to, for example, 1.5 V). The driver of measurement module 130 may be uncoupled from capacitor 140 for a second period of time. During this second period of time, the capacitor may continue to be charged, by voltage source 110, to 2 V. After this second period of time, a voltage measurement circuit of measurement module 130 may measure the capacitor's voltage as 2 V. Based on this measurement (and knowing at least the ratio of resistance of the two resistors of the voltage divider circuit), the voltage of voltage source 110 may be calculated to be 4 V. The capacitor may have been charged for a measurement faster and/or with less power loss through the voltage divider circuit than if only voltage source 110 through the voltage divider circuit was used for charging the capacitor without pre-charging by a driver. Though the capacitor's voltage asymptotically approaches the Thevenin voltage of the voltage supply, once the voltage is within a measurement resolution, the calculated voltage is sufficiently close to 4 V.

Capacitor 140 may represent one or more capacitors. Capacitor 140 may be coupled with measurement module 130. Capacitor 140 may be coupled with ground (not illustrated).

Figure 2:
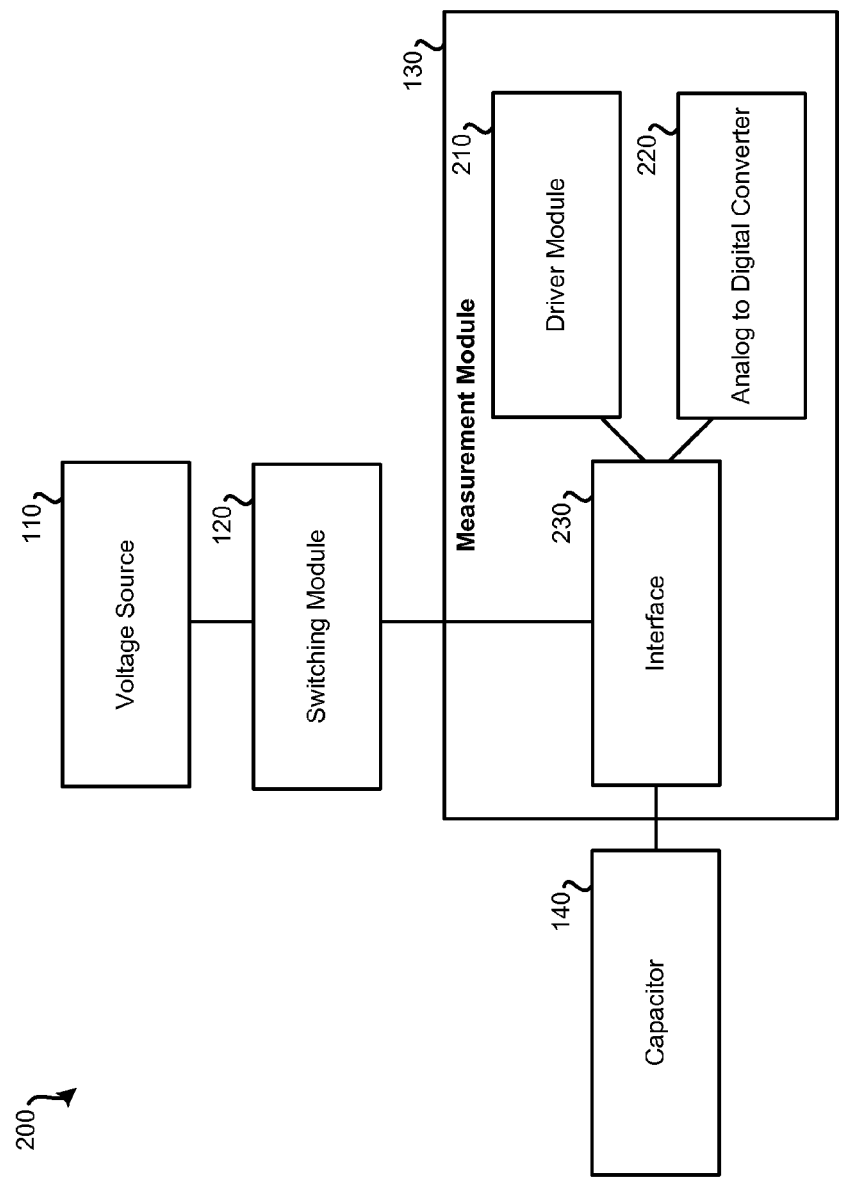
FIG. 2 illustrates another block diagram of an embodiment of a system for determining a voltage of a voltage source using pre-charging.

FIG. 2 illustrates another block diagram of an embodiment of a system 200 for determining a voltage of a voltage source using pre-charging. System 200 may represent a more detailed embodiment of system 100, or may represent a separate system. Voltage source 110, switching module 120, and capacitor 140 may be as described in relation to system 100 of FIG. 1. Measurement module 130 may comprise subcomponents: driver module 210, analog to digital converter (ADC) 220, and interface 230.

Driver module 210 may be used to pre-charge capacitor 140 to accelerate charging performed by voltage source 110 via interface 230. When active and coupled with capacitor 140, driver module 210 may provide more current to charge capacitor 140 than voltage source 110 via interface 230 alone. When driver module 210 is charging capacitor 140, voltage source 110, via interface 230, may also be charging capacitor 140, or, in some embodiments, only driver module 210 may be used to charge capacitor 140. Driver module 210 may be a digital driver configured to output a voltage similar to voltage source 110. Indeed, power for driver module 210 may be supplied by voltage source 110, as such, the maximum voltage supplied by driver module 210 may be the voltage of voltage source 110. The voltage supplied by driver module 210 to capacitor 140 may be greater than the voltage supplied to capacitor 140 by voltage source 110 via the voltage divider circuit.

ADC 220 may be used to measure the voltage of capacitor 140. ADC 220 may be required to draw a minimum amount of current in order to perform an accurate voltage measurement. ADC 220 may receive, as an input, a voltage from capacitor 140 via interface 230. ADC 220 may create a digital representation of the magnitude of this voltage. The digital representation may be output to another component. The digital representation may be used to calculate the voltage of voltage source 110 and/or may be output to some other device, such as for presentation to a user or to an administrative service that monitors a voltage (such as a battery voltage) in multiple devices. Such an administrative service may performed locally or remotely from the device that has the voltage being monitored.

Interface 230 may serve to couple driver module 210 and ADC 220 to capacitor 140 (and, possibly, voltage source 110 via switching module 120). Interface 230 may include a voltage divider circuit. Interface 230 may permanently connect driver module 210, ADC 220, and capacitor 140 with each other (e.g., interface 230 comprises a trace or wire connecting the three components). Interface 230 may be configured to alternatively couple and uncouple driver module 210 and ADC 220 with capacitor 140. For example, while driver module 210 is connected with capacitor 140, ADC 220 may not be coupled with capacitor 140; while ADC 220 is coupled with capacitor 140 via interface 230, driver module 210 may be uncoupled from capacitor 140.

Figure 3:
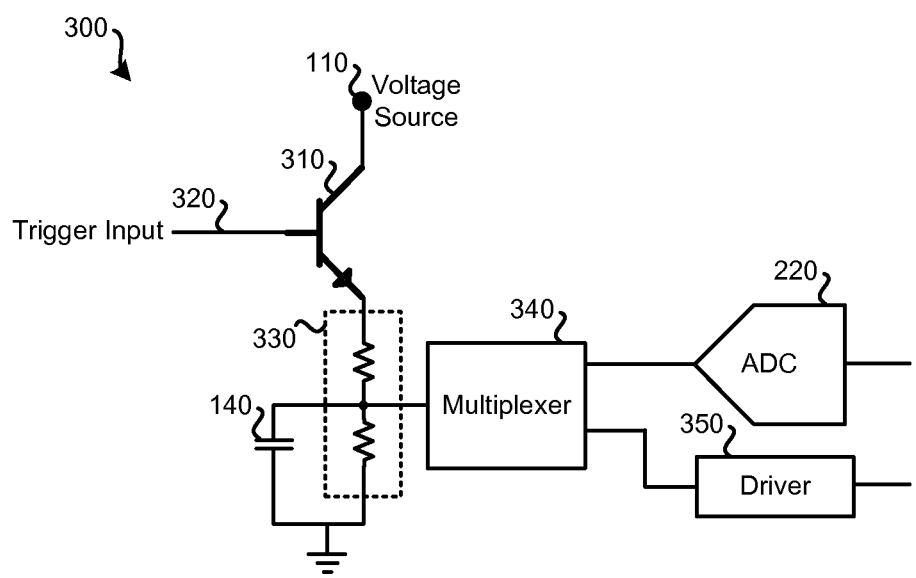
FIG. 3 illustrates a circuit diagram of an embodiment of a system for determining a voltage of a voltage source using pre-charging.

FIG. 3 illustrates a circuit diagram of an embodiment of a system 300 for determining a voltage of a voltage source using pre-charging. System 300 may represent a more detailed embodiment of system 100 and/or system 200, of FIGS. 1 and 2, respectively. System 300 may also represent a separate system. System 300 may include: voltage source 110, switch 310, trigger input 320, voltage divider circuit 330, multiplexer 340, ADC 220, driver module 350, and capacitor 140.

Voltage source 110 may be coupled with switch 310. Switch 310 may represent switching module 120 of FIGS. 1 and 2, or some component thereof. Switch 310 may be a transistor, such as a bipolar junction transistor (BJT), as illustrated in system 300. Switch 310, as illustrated, may be an NPN BJT. As such, when a sufficiently great enough voltage is applied to trigger input 320 (which is connected to the gate of the BJT), voltage source 110 is coupled with voltage divider circuit 330. If a sufficiently low enough voltage is applied to trigger input 320 or no voltage is applied, voltage source 110 may not be coupled with voltage divider circuit 330. For example, when a measurement of the voltage of voltage source 110 does not need to be performed, voltage source 110 may remain uncoupled from voltage divider circuit 330, thus reducing power consumption. In other embodiments, a PNP BJT may be used. In such embodiments, a sufficiently low enough voltage may be applied to trigger input 320 to couple voltage source 110 to voltage divider circuit 330. A sufficient high enough voltage applied to trigger input 320 may uncouple voltage source 110 from voltage divider circuit 330.

Interface 230 of FIG. 2 may be represented in FIG. 3 by voltage divider circuit 330 and multiplexer 340. Voltage divider circuit 330 may comprise two resistors. Resistors with a high resistance may be used to decrease power consumption. For example, 100 k ohm resistors may be used. The resistance of each resistor (or a known ratio between the resistance of the resistors) may be used to calculate the voltage of voltage source 110 using a voltage measured between the two resistors of voltage divider circuit 330. As those with skill in the art will recognize, a voltage divider circuit may be constructed using various numbers of resistors.

Multiplexer 340 may serve to connect ADC 220 and driver 350 (which may represent driver module 210 or some component thereof) to voltage divider circuit 330. An input to multiplexer 340 (not illustrated) may select whether ADC 220 or driver 350 is connected with voltage divider circuit 330. In some embodiments, only one of ADC 220 or driver 350 is connected with voltage divider circuit 330 at a particular time. Multiplexer 340 may be used to connect driver 350 to voltage divider circuit 330 for a period of time. While driver 350 is connected to voltage divider circuit 330, driver 350 may be used to charge capacitor 140. While driver 350 is charging capacitor 140, capacitor 140 may also be being charged by voltage source 110 via switch 310 and voltage divider circuit 330. After a period of time, driver 350 may stop charging capacitor 140 and/or multiplexer 340 may disconnect driver 350 from voltage divider circuit 330 and capacitor 140. Multiplexer 340 may disconnect driver 350 and couple ADC 220 to voltage divider circuit 330 and capacitor 140. After a second period of time, ADC 220 may measure the voltage of capacitor 140.

In system 300, ADC 220, driver 350, and multiplexer 340 may be discrete components. In some embodiments, one or more of these components may be combined. For example, a microcontroller unit (MCU) may contain driver 350 and ADC 220.

Figure 4:
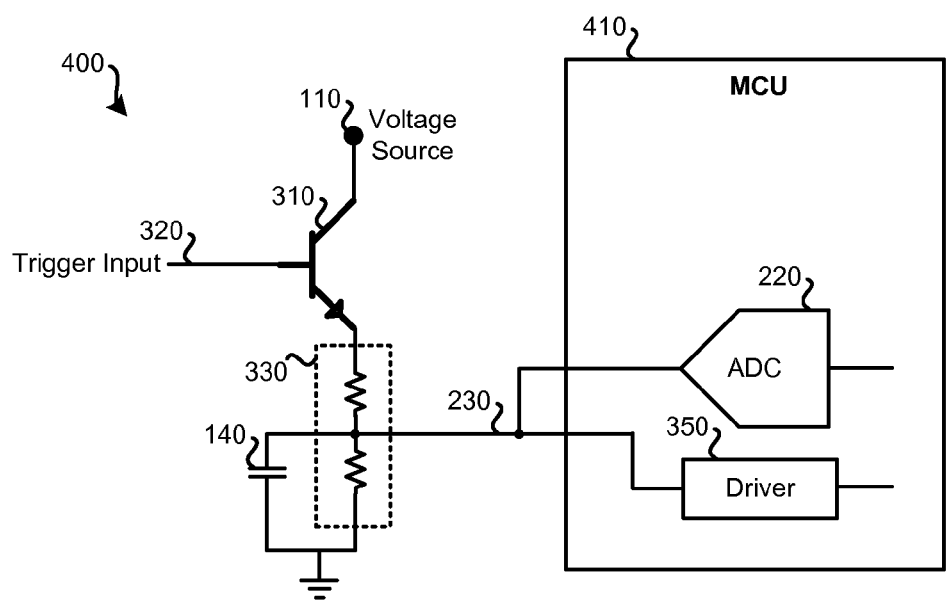
FIG. 4 illustrates another circuit diagram of an embodiment of a system for determining a voltage of a voltage source using pre-charging.

FIG. 4 illustrates another circuit diagram of an embodiment of a system 400 for determining a voltage of a voltage source using pre-charging. System 400 may represent a more detailed embodiment of system 100, system 200, and/or system 300 of FIGS. 1, 2, and 3, respectively. System 400 may also represent a system separate from systems 100 through 300.

In system 400, MCU 410 may include ADC 220 and driver 350. Rather than using a multiplexer, interface 230 of system 400 comprises electrical coupling (e.g., wiring) ADC 220 and driver 350 together. For example, this may include connecting two pins of MCU 410 together. When driver 350 is not charging capacitor 140, driver 350 may be in a high impedance state such as not to affect operation of ADC 220. Likewise, when not in use, ADC 220 may remain in a high impedance state as to not affect driver 350. MCU 410 may control when driver 350 and ADC 220 are active. In some embodiments, trigger input 320 may be generated by MCU 410. MCU 410 may be configured with an amount of time which capacitor 140 should be charged and a second period of time in which capacitor 140 should remain coupled with voltage source 110 before ADC 220 is used to measure the voltage of capacitor 140. MCU 410 may also be configured to calculate the voltage of voltage source 110 using one or more measurements by ADC 220. The amount of time which driver 350 charges capacitor 140 may be varied by MCU 410 based on one or more previous voltage measurements performed by ADC 220.

The remainder of system 400, including voltage source 110, switch 310, trigger input 320, voltage divider circuit 330, and capacitor 140 may remain unchanged from system 300 of FIG. 3. MCU 410 may be configured to perform other functions in addition to those of driver 350 and ADC 220.

Figure 5:
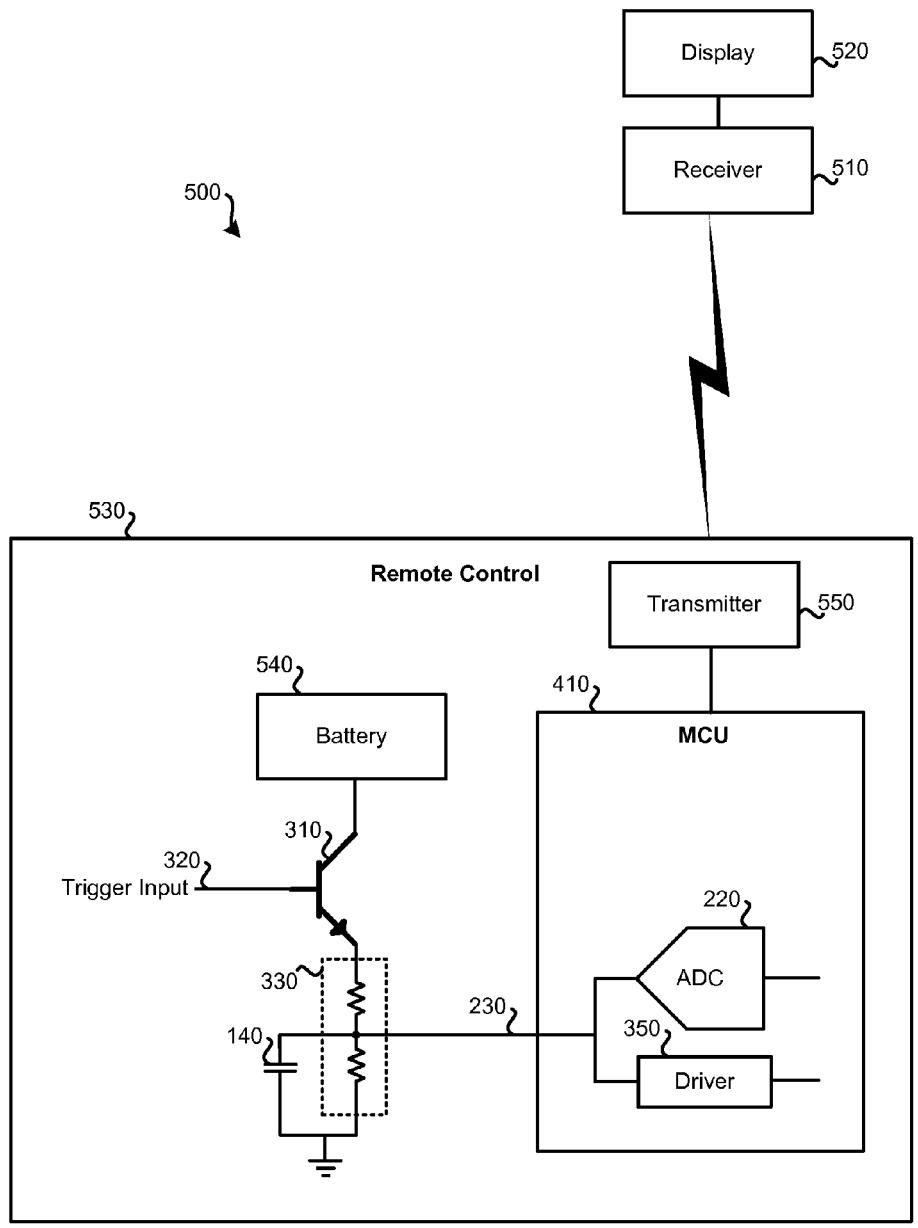
FIG. 5 illustrates yet another circuit diagram of an embodiment of a system for determining a voltage of a voltage source using pre-charging.

FIG. 5 illustrates yet another circuit diagram of an embodiment of a system 500 for determining a voltage of a voltage source using pre-charging. In system 500, an embodiment of system 400 is implemented within remote control 530. Remote control 530 may be used to control some other device, such as a television or a set top box. Onboard remote control 530, battery 540 serves as the voltage source. As such, the voltage of battery 540 may be monitored, at least periodically, to determine whether battery 540 should be replaced or recharged. In addition to components of system 400, MCU 410 may be coupled with transmitter 550. The transmitter may be collocated with the MCU, for example on the same circuit board, within the same package, or even on the same chip die.

Coupling of ADC 220 and driver 350 may occur onboard MCU 410. As such, interface 230 may comprise a single pin of MCU 410. Depending on whether ADC 220 or driver 350 is active, the other component may be in a high impedance state. Control of which component is active at a given time may be controlled by MCU 410.

Transmitter 550 may be configured to transmit data to receiver 510. Receiver 510 may be part of a television or a set top box. Transmitter 550 may be configured to transmit data such as an indication that the channel should be changed or the volume should be adjusted to receiver 510. Transmitter 550 may also be configured to transmit data related to the voltage of battery 540. This data may be received by receiver 510, processed, and presented to a user via display 520. For example, when the voltage of battery 540 decreases to below a threshold voltage, a warning indicator may be presented to the user via display 520 that indicates the battery (or batteries) needs replacing or recharging.

In some embodiments, a user may provide input triggering a battery voltage measurement. Such input may trigger a voltage measurement. In some embodiments, the user may be presented with data from the most recent previous voltage measurement. In other embodiments, the receiver 510 may trigger a voltage measurement by transmitting an indication to the remote.

Figure 6:
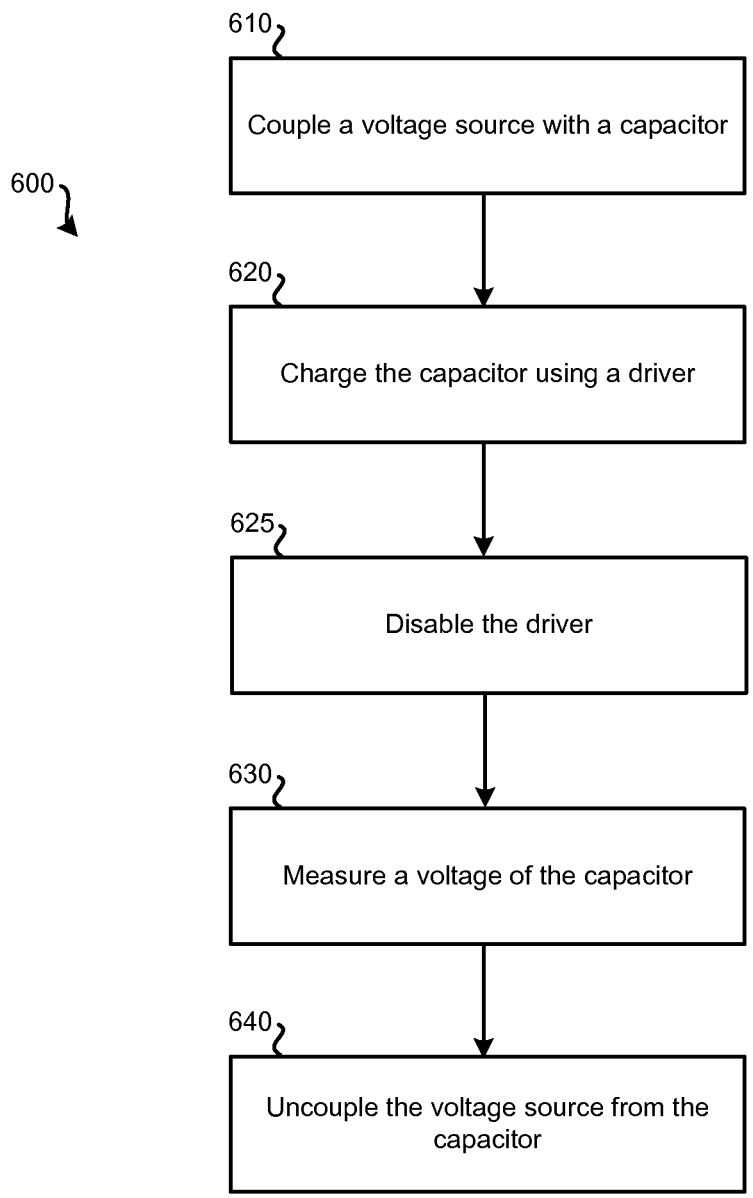
FIG. 6 illustrates an embodiment of a method for determining a voltage of a voltage source using pre-charging.

Systems 100 through 500 of FIGS. 1-5, respectively, may be used to perform various methods. FIG. 6 illustrates an embodiment of a method 600 for determining a voltage of a voltage source using pre-charging. Method 600 may be performed by each of systems 100 though 500. Alternatively, method 600 may be performed by some other system for measuring a voltage of a voltage source using pre-charging.

At step 610, a voltage source may be coupled with a capacitor. The voltage source may be the voltage source that is desired to be measured. The capacitor may be used to provide sufficient current to the component conducting the voltage measurement to allow for an accurate measurement. Referring to system 400, the voltage source may be voltage source 110 and the capacitor may be capacitor 140. Electrically coupling a voltage source 110 to capacitor 140 may include closing a switch, such as switch 310 to allow current from voltage source 110 to charge capacitor 140. Voltage source 110 may be coupled with capacitor 140 via one or more other circuits, such as voltage divider circuit 330.

At step 620, the capacitor may be charged using a driver. This charging, because it refers to charging occurring before only the capacitor and the voltage source are coupled, may be referred to as pre-charging. The driver may provide more current and/or a higher voltage than the voltage source thus charging the capacitor quicker than only the voltage source via the voltage divider circuit. Referring again to system 400 of FIG. 4, driver 350 may be used to at least partially charge capacitor 140. Driver 350 may charge capacitor 140 faster then voltage source 110. This may be due to the increased resistance between voltage source 110 and capacitor 140 and/or because driver 350 may be configured to apply a greater voltage to capacitor 140, thus increasing the voltage of capacitor 140 faster. While driver 350 is charging capacitor 140, voltage source 110 may also be coupled with capacitor 140. Having both voltage source 110 and driver 350 coupled with capacitor 140 may further decrease the charge time of capacitor 140. In some embodiments, only driver 350 (and not voltage source 110) may be coupled with capacitor 140 for charging. The amount of time the driver is used to charge the capacitor may be based on a median amount of time that is expected to be needed to charge the capacitor to the voltage expected in the voltage divider circuit. For example, if the voltage source is expected to typically be in the range of 2 V to 4 V as measured in the voltage divider circuit, the driver may be used to charge the capacitor to 3 V. After the pre-charge period of step 620, the driver is disconnected or otherwise disabled, and the voltage source alone is connected to the capacitor for a sufficient settling time at step 625 (based on required measurement resolution and other system parameters).

At step 630, the voltage of the capacitor may be measured. An accurate measurement may be conducted after a shorter charging time because the driver was used to at least partially charge the capacitor rather than only using the voltage source via a voltage divider circuit. If only the voltage source was used to charge the capacitor via the voltage divider circuit, a greater amount of time and/or power (due to system overhead) may be consumed during the charging process. When the voltage of the capacitor is measured, the capacitor may have reached, at least approximately, a steady-state voltage that is representative of the voltage of the voltage source. As such, by being representative of the voltage of the voltage source, the voltage of the capacitor may be used to calculate the voltage of the voltage source. For example, since the capacitor may be coupled with a voltage divider circuit, the voltage of the capacitor in conjunction with a ratio of the resistance of the resistors of the voltage divider circuit may be used to calculate the voltage of the voltage source. In some embodiments, no calculation of the voltage of the voltage source may be necessary, rather, the voltage of the capacitor may be used directly to determine whether the voltage source is in need of recharging or replacing. Referring to system 400, the measurement may be conducted by an analog to digital converter, such as ADC 220. Such an ADC may require more current than is available via voltage divider circuit 330. As such, capacitor 140 allows an increased amount of current to be drawn by ADC 220 to permit an accurate voltage measurement to be conducted.

At step 640, the voltage source may be uncoupled from the capacitor. As such, the capacitor may discharge through the voltage divider circuit to ground and the capacitor may become completely discharged. Once the voltage source has been uncoupled from the capacitor and the remainder of the circuit, no or little power may be consumed until another voltage measurement is to be conducted. Referring to system 400, voltage source 110 may be uncoupled from voltage divider circuit 330, capacitor 140, ADC 220, and driver 350 by opening switch 310. The state of switch 310 may be controlled by trigger input 320.

Figure 7:
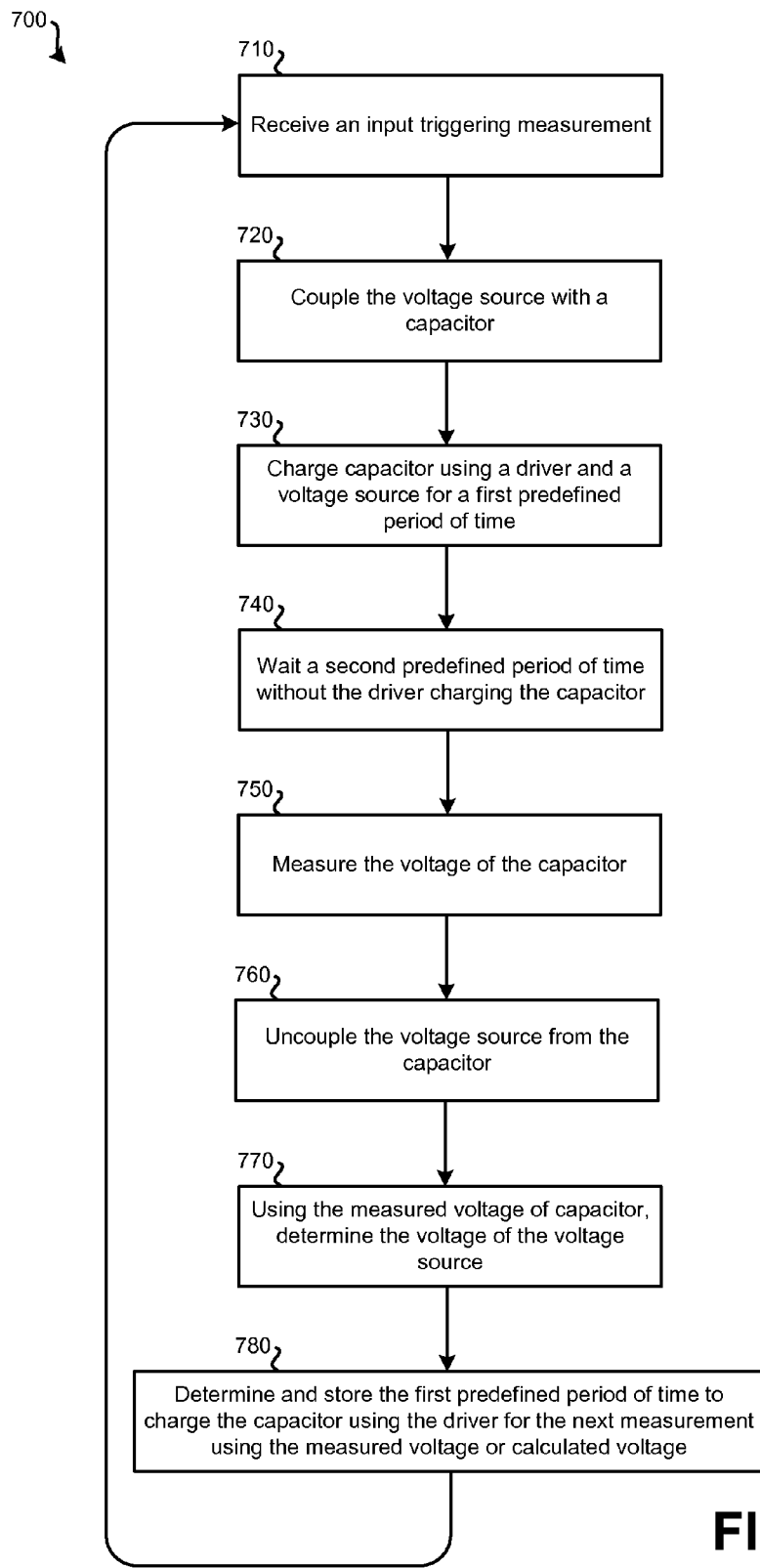
FIG. 7 illustrates another embodiment of a method for determining a voltage of a voltage source using pre-charging.

FIG. 7 illustrates another embodiment of a method 700 for determining a voltage of a voltage source using pre-charging. Method 700 may be performed by each of systems 100 though 500 of FIGS. 1-5, respectively. Alternatively, method 700 may be performed by some other system for measuring a voltage of a voltage source using pre-charging. At step 710, input may be received that triggers a voltage measurement. This input may be received from the user (e.g., by pressing a button on a remote control) or may be generated periodically such as by an MCU (e.g., a voltage measurement may be conducted once per day).

At step 720, the voltage source may be coupled with a capacitor. The voltage source may be the voltage source that is desired to be measured. The capacitor may be used to provide sufficient current to the component conducting the voltage measurement to allow for an accurate measurement. In some embodiments, more than one capacitor may be used. For example, multiple capacitors may be placed in parallel to increase the overall capacitance. Referring to system 400, the voltage source may be voltage source 110 and the capacitor may be capacitor 140. Voltage source 110 may represent one or more batteries. Coupling voltage source 110 to capacitor 140 may include closing a switch, such as switch 310, to allow current from voltage source 110 to charge capacitor 140. Closing switch 310 may include holding trigger input 320 high while voltage source 110 is to be electrically coupled with capacitor 140. Voltage source 110 may be electrically coupled with capacitor 140 via one or more other circuits, such as voltage divider circuit 330. The amount of current flowing from voltage source 110 to capacitor 140 and/or the voltage at capacitor 140 may be affected by other components of the circuit, such as voltage divider circuit 330 and/or switch 310. For example, the current and voltage available to charge capacitor 140 may be affected by the resistance of the resistors of voltage divider circuit 330.

At step 730, a driver may be used to at least partially charge the capacitor. At least while the capacitor is being charged, the ADC may be uncoupled from the capacitor and/or placed in a high-impendence state. The driver may provide more current and/or a higher voltage than the voltage source via the switch and voltage divider circuit. Referring again to system 400 of FIG. 4, driver 350 may be used to at least partially charge capacitor 140. Driver 350 may charge capacitor 140 faster than voltage source 110 alone. This may be due to the increased resistance between voltage source 110 and capacitor 140 and/or because driver 350 may be configured to apply a greater voltage to capacitor 140, thus increasing the voltage of capacitor 140 faster. While driver 350 is charging capacitor 140, voltage source 110 may also be coupled with capacitor 140. Having both voltage source 110 and driver 350 coupled with capacitor 140 may decrease the charge time of capacitor 140. In some embodiments, only driver 350 (and not voltage source 110 via the voltage divider circuit) may be coupled with capacitor 140 for charging.

The amount of time which the driver is used to charge the capacitor may be predefined. For example, the first predefined period of time may be an amount of time that is expected to charge the capacitor to a minimum threshold voltage. If the voltage at the capacitor is below the minimum threshold voltage, it may be expected that a circuit, such as an MCU, may not be able to operate using the voltage source for power. As such, if a voltage measurement is to occur, the voltage at the capacitor may be reasonably expected to always be at least the minimum threshold voltage. In some embodiments, the first predefined period of time used to charge the capacitor may be based on one or more previous voltage measurements of the capacitor. The driver may be used to charge the capacitor to the voltage of the previous measurement. In some embodiments, the driver may be used to charge the capacitor to a voltage based on the previous measurement, such as 95% of the previous measurement. While the driver is charging the capacitor, the voltage source may also be coupled with the capacitor via a switch and the voltage divider circuit. Having the voltage source also coupled with the capacitor may speed charging of the capacitor.

After the capacitor has been at least partially charged using the driver at step 730, a second predefined period of time without the driver charging the capacitor may elapse at step 740. During the second predefined period of time, the capacitor may remain coupled with the voltage source via a voltage divider circuit and the switch. During this second period of time, the voltage of the capacitor will charge or discharge from the voltage the capacitor was charged to using the driver to the voltage created by the voltage source through the voltage divider circuit. The amount of time for the voltage of the capacitor to at least approximately represent the voltage of the voltage source (as affected by the voltage divider circuit) may be decreased due to the capacitor being at least partially charged by the driver circuit. For example, if the driver circuit charged the capacitor to 2.2 V, and the voltage created by the voltage source on the voltage divider circuit (between the resistors) is 2.5 V, it may take a shorter period of time to charge from 2.2 V to 2.5 V, than from 0 V to 2.5 V (which may have occurred if no driver circuit was used to pre-charge the capacitor. As such, by using the driver to pre-charge the capacitor, the amount of time for the capacitor to accurately reflect the voltage of the voltage source via the voltage divider circuit and/or the total power consumed to perform the measurement may be decreased. The second predefined period of time may be a stored, predefined period of time. For example, a certain number of milliseconds may always be waited after the driver has stopped charging the capacitor before the voltage of the capacitor is measured to allow the capacitor to accurately reflect the voltage of the voltage source via the voltage divider circuit. This second predefined period of time may be stored by a module, such as an MCU. Referring to system 400 of FIG. 4, MCU 410 may pre-charge capacitor 140 using driver 350. Driver 350 may then enter a high impedance state. Before ADC 220 is used to conduct a measurement of the voltage of capacitor 140, the second predefined period of time may be waited by MCU 410.

At step 750 the voltage of the capacitor may be measured. At least during step 750, the driver may be uncoupled from the capacitor and/or placed in a high impedance state. When the voltage of the capacitor is measured at step 750, the voltage of the capacitor may accurately represent the voltage of the voltage source as affected by the voltage divider circuit. As such, by measuring the voltage of the capacitor, the voltage of the voltage source may be calculated. The measurement of the voltage may be conducted sooner since the driver was used to at least partially charge the capacitor. If only the voltage source was used to charge the capacitor via the voltage divider circuit, a greater amount of time and/or power may be consumed during the charging process. Referring to system 400, the measurement may be conducted by ADC 220. ADC 220 may require more current than can be drawn via voltage divider circuit 330. As such, capacitor 140 allows an increased amount of current to be drawn by ADC 220 while allowing an accurate voltage measurement to be conducted.

At step 760, the voltage source may be uncoupled from the capacitor. As such, the capacitor may discharge through the voltage divider circuit to ground so that the capacitor completely discharges. Once the voltage source has been uncoupled from the capacitor and the remainder of the circuit, no or little power may be consumed until another voltage measurement is to be conducted. Referring to system 400, voltage source 110 may be uncoupled from voltage divider circuit 330, capacitor 140, ADC 220, and driver 350 by opening switch 310. The state of switch 310 may be controlled by trigger input 320, which may be coupled with MCU 410 or some other controller circuit.

At step 770, since the capacitor may have been coupled with a voltage divider circuit, the previously measured voltage of the capacitor in conjunction with a ratio of the resistance of the resistors of the voltage divider circuit may be used to calculate the voltage of the voltage source. In some embodiments, no calculation of the voltage of the voltage source may be necessary, rather, the previously measured voltage of the capacitor may be used directly to determine whether the voltage source is in need of recharging or replacing. The measurement conducted by ADC 220 may be used by MCU 410 to compute the voltage of voltage source 110 (MCU 410 may store a ratio of the resistance of the resistors or a ratio of the resistance of the resistors of the voltage divider circuit). The computed voltage, or the raw measurement by ADC 220, may be transferred to one or more other components.

At step 780, the first predefined period of time that is used to charge the capacitor using the driver for the next measurement may be determined based on the previously measured voltage of the capacitor, or upon the computed voltage. The computed voltage or the raw measurement by ADC 220 may be stored by MCU 410. This computed voltage or the raw measurement may be used to determine the amount of time driver 350 should be used to charge capacitor 140 for the next voltage measurement. As such, MCU 410 may store an amount of time to be used for pre-charging by the driver of the capacitor for the next measurement. Following step 780, at some point in the future, another voltage measurement may be conducted. In this next measurement, the determined first period of time may be used to charge the capacitor by the driver.

Figure 8:
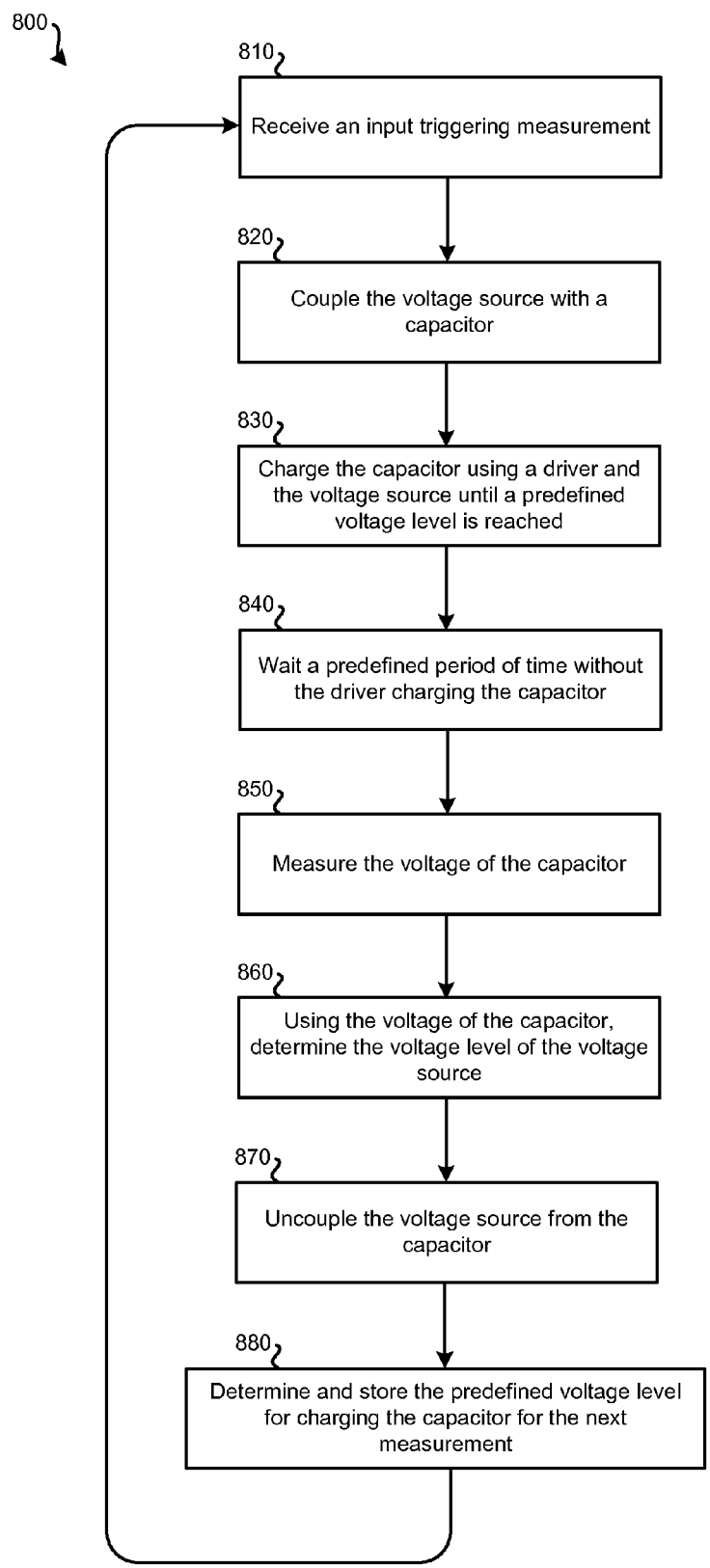
FIG. 8 illustrates yet another embodiment of a method for determining a voltage of a voltage source using pre-charging.

FIG. 8 illustrates yet another embodiment of a method for determining a voltage of a voltage source using pre-charging. Method 800 may be performed by each of systems 100 though 500. Alternatively, method 800 may be performed by some other system for measuring a voltage of a voltage source using pre-charging. Steps 810 and 820 correspond to steps 710 and 720 of method 700 of FIG. 7.

At step 830, a driver may be used to at least partially charge the capacitor. The driver may provide more current and/or a higher voltage than the voltage source via the switch and voltage divider circuit. Referring again to system 400 of FIG. 4, driver 350 may be used to at least partially charge capacitor 140. Charging may occur similarly to charging in step 730 of method 700. The voltage the driver is used to charge the capacitor to may be predefined. This voltage may be defined based on one or more previous measurements. The voltage the capacitor is to be charged to may be used to calculate a period of time which the driver should charge the capacitor. For example, an MCU may be able to calculate or may access a look-up table to determine an amount of time that the capacitor should be pre-charged by the driver in order to obtain the predefined voltage.

Steps 840 through 870 correspond to steps 740 through 770 of method 700 of FIG. 7. At step 880, the predefined voltage for charging the capacitor may be determined and stored for the next voltage measurement. The voltage may be the voltage measured by the ADC at step 850. In some embodiments, some percentage of the measured voltage is used, such as 95%. This voltage may be stored and used for charging the capacitor for a future voltage measurement.

The methods, systems, circuits, and devices discussed above are examples. Various configurations may omit, substitute, or add various procedures or components as appropriate. For instance, in alternative configurations, the methods may be performed in an order different from that described, and/or various stages may be added, omitted, and/or combined. Also, features described with respect to certain configurations may be combined in various other configurations. Different aspects and elements of the configurations may be combined in a similar manner. Also, technology evolves and, thus, many of the elements are examples and do not limit the scope of the disclosure or claims.

Specific details are given in the description to provide a thorough understanding of example configurations (including implementations). However, configurations may be practiced without these specific details. For example, well-known circuits, processes, algorithms, structures, and techniques have been shown without unnecessary detail in order to avoid obscuring the configurations. This description provides example configurations only, and does not limit the scope, applicability, or configurations of the claims. Rather, the preceding description of the configurations will provide those skilled in the art with an enabling description for implementing described techniques. Various changes may be made in the function and arrangement of elements without departing from the spirit or scope of the disclosure.

Also, configurations may be described as a method which is depicted as a flow diagram or block diagram. Although each may describe the operations as a sequential process, many of the operations can be performed in parallel or concurrently. In addition, the order of the operations may be rearranged. A process may have additional steps not included in the figure. Furthermore, at least portions of the methods may be implemented by hardware, software, firmware, middleware, microcode, hardware description languages, or any combination thereof. When implemented in software, firmware, middleware, or microcode, the program code or code segments to perform the necessary tasks may be stored in a non-transitory computer-readable medium such as a storage medium. Processors may perform the described tasks.

Having described several example configurations, various modifications, alternative constructions, and equivalents may be used without departing from the spirit of the disclosure. For example, the above elements may be components of a larger system, wherein other rules may take precedence over or otherwise modify the application of the invention. Also, a number of steps may be undertaken before, during, or after the above elements are considered. Accordingly, the above description does not bound the scope of the claims.

What is claimed is:

1. A system for determining a voltage of a voltage source, the system comprising:
   a measurement module comprising:
      an analog to digital converter,
      a driver, and
      an interface,
      wherein:
         the interface is electrically coupled with the analog to digital converter and the driver,
         the driver is configured to output current to charge a capacitor,
         after a first predefined period of time, the driver stops outputting current to pre-charge the capacitor, and
         after the driver has stopped pre-charging the capacitor and a second predefined period of time has elapsed, the analog to digital converter is configured to measure a voltage of the capacitor;
   the capacitor, wherein the capacitor is electrically coupled with the interface of the measurement module; and
   a switching module configured to electrically couple the interface of the measurement module and the capacitor with the voltage source at least while the driver is charging the capacitor and the analog to digital converter is measuring the voltage of the capacitor.

2. The system for determining the voltage of the voltage source of claim 1, wherein the measurement module further comprises a processing module configured to:
   determine the first predefined period of time using one or more previous measurements of the capacitor's voltage.

3. The system for determining the voltage of the voltage source of claim 2, wherein during the second predefined period of time, the capacitor is electrically coupled with the voltage source.

4. The system for determining the voltage of the voltage source of claim 1, wherein the first predefined period of time is selected to charge the capacitor to a median voltage.

5. The system for determining the voltage of the voltage source of claim 1, wherein the system further comprises:
   a voltage divider circuit comprising a first resistor and a second resistor, wherein:
      the first resistor is electrically coupled with the voltage source and the interface;
      the second resistor is electrically coupled with the interface.

6. The system for determining the voltage of the voltage source of claim 1, wherein the measurement module is part of a microcontroller of a remote control.

7. The system for determining the voltage of the voltage source of claim 1, wherein the voltage source is at least one battery.

8. The system for determining the voltage of the voltage source of claim 1, wherein the measurement module further comprises a multiplexer, wherein:
   the driver and analog to digital converter are electrically coupled with inputs of the multiplexer; and
   an output of the multiplexer is electrically coupled with the interface.

9. A system for determining a voltage of a battery of a remote control, the system comprising:
   a transmitter configured to transmit data to a set top receiver;

the set top receiver configured to:
  receive data from the transmitter; and
  store battery charge information; and
the remote control, wherein the remote control comprises:
  a capacitor;
  a microcontroller unit (MCU) comprising:
    an analog to digital converter (ADC); and
    a driver, wherein:
      the driver and the ADC are electrically coupled with the capacitor;
      the driver of the MCU is configured to output current to pre-charge the capacitor;
      after a first predefined period of time, the MCU is configured to stop outputting current via the driver to pre-charge the capacitor;
      after the driver of the MCU has stopped pre-charging the capacitor and a second predefined period of time has elapsed, the ADC of the MCU is configured to measure a voltage of the capacitor; and
  a switch configured to electrically couple the battery with the ADC and the driver of the MCU at least while the driver is charging the capacitor and the analog to digital converter is measuring the voltage of the capacitor.

10. The system for determining the voltage of the battery of the remote control of claim 9, wherein:
  the MCU is further configured to output an indication of the voltage of the capacitor to the transmitter; and
  the set top receiver is configured to present battery charge information via a display based on the voltage of the capacitor.

* * * * *